(12) United States Patent
Wang et al.

(10) Patent No.: US 7,189,606 B2
(45) Date of Patent: Mar. 13, 2007

(54) METHOD OF FORMING FULLY-DEPLETED (FD) SOI MOSFET ACCESS TRANSISTOR

(75) Inventors: Hongmei Wang, Boise, ID (US); John K. Zahurak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/161,615

(22) Filed: Jun. 5, 2002

(65) Prior Publication Data

US 2003/0227056 A1 Dec. 11, 2003

(51) Int. Cl.
*H01L 21/8238* (2006.01)

(52) U.S. Cl. ............... 438/202; 438/219; 438/234

(58) Field of Classification Search .......... 438/202, 438/219, 234, 694; 257/341, 347, 296, 350, 257/348, 407
See application file for complete search history.

(56) References Cited

U.S. PATENT DOCUMENTS

| | | | |
|---|---|---|---|
| 5,340,759 A | 8/1994 | Hsieh et al. | |
| 5,536,962 A * | 7/1996 | Pfiester | 257/392 |
| 6,060,749 A | 5/2000 | Wu | |
| 6,100,120 A * | 8/2000 | Yu | 438/151 |
| 6,277,675 B1 | 8/2001 | Tung | |
| 6,288,949 B1 | 9/2001 | Hidaka et al. | |
| 6,294,817 B1 * | 9/2001 | Srinivasan et al. | 257/397 |
| 6,331,458 B1 | 12/2001 | Anjum et al. | |
| 6,339,244 B1 | 1/2002 | Krivokapic | |
| 6,391,752 B1 * | 5/2002 | Colinge et al. | 438/585 |
| 6,417,051 B1 | 7/2002 | Takebuchi | |
| 6,424,009 B1 * | 7/2002 | Ju | 257/347 |
| 6,424,016 B1 * | 7/2002 | Houston | 257/407 |
| 6,432,763 B1 * | 8/2002 | Yu | 438/217 |
| 6,452,229 B1 | 9/2002 | Krivokapic | |
| 6,484,065 B1 | 11/2002 | Yu et al. | |
| 6,548,361 B1 * | 4/2003 | En et al. | 438/301 |
| 6,552,401 B1 | 4/2003 | Dennison | |
| 6,653,700 B2 * | 11/2003 | Chau et al. | 257/412 |
| 6,661,058 B2 * | 12/2003 | Ahn et al. | 257/344 |
| 6,759,706 B2 * | 7/2004 | Kobayashi | 257/314 |
| 6,815,297 B1 * | 11/2004 | Krivokapic et al. | 438/287 |

OTHER PUBLICATIONS

S. M. Size, "Physics of Semiconductor Devices," John Wiley & Sons, New York (1981), pp. 454-455.*
Syd R. Wilson, Clarence J. Tracy, and John L. Freeman, Jr., "Handbook of Multilevel Metallization for Integrated Circuits," Noyes Publ.,Westwood, New Jersey, (1993), pp. 259-264.*
Gary E. McGuire, "Semiconductor Materials and Ptocess Technology Handbook," Noyes Publ., Norwich, New York, (1988) pp. 46-47.*
Julian J. Sanchez, Kelvin K. Hsueh, and Thomas A. DeMassa, "Drain-Engineered Hot-Electron-Resistant Device Structures: A Review," IEEE Trans. on Electron Devices, vol. 36, No. 6, (1989), pp. 1125-1132.*
S. Wolf, "Silicon Processing for the VLSI Era, Vol. 3—The Submicron MOSFET," Lattice Press, Sunset Beach, CA (1995), pp. 135-137.*

* cited by examiner

*Primary Examiner*—Douglas W. Owens
(74) *Attorney, Agent, or Firm*—Dickstein Shapiro LLP

(57) ABSTRACT

A fully-depleted (FD) Silicon-on-Insulator (SOI) MOSFET access transistor comprising a gate electrode of a conductivity type which is opposite the conductivity type of the source/drain regions and a method of fabrication are disclosed.

14 Claims, 10 Drawing Sheets

METHOD OF FORMING FULLY-DEPLETED (FD) SOI MOSFET ACCESS TRANSISTOR

FIELD OF THE INVENTION

The present invention relates to the field of semiconductor integrated circuits and, in particular, to Silicon-on-Insulator (SOI) devices.

BACKGROUND OF THE INVENTION

Silicon-on-Insulator (SOI) technology employs a layer of semiconductor material formed over an insulating layer on a supporting bulk wafer. The structure can be formed by different well-known techniques in the art, for example, separation by implanted oxygen (SIMOX), bonding and etching back (BESOI), and zone melting and recrystallization (ZMR), among others. Typically, the structure comprises a film of monocrystalline silicon formed on a buried layer of silicon dioxide which is formed on a monocrystalline silicon substrate.

One technique for the formation of a SOI substrate by a conventional bonding and etching back method of the prior art is illustrated in FIGS. 1–4. The process starts with the preparation of a silicon substrate 10 (FIG. 1). The silicon substrate 10 is thermally oxidized to grow a layer of silicon oxide 12 (FIG. 1), with a thickness of about 1,000 Å to about 2 μm. Subsequently, a single crystalline silicon substrate 14 is opposed to the silicon oxide layer 12, as shown in FIG. 2. The silicon substrate 10, with the oxide layer 12, is then contacted with the crystalline silicon substrate 14, and the resultant structure is heated to a temperature of about 1000° C., so that the crystalline silicon of the crystalline silicon substrate 14 adheres to the silicon oxide layer 12, as shown in FIG. 3. Next, as illustrated in FIG. 4, the crystalline silicon substrate 14 is polished and its thickness is decreased to approximately 1.5 microns. Thus, a SOI substrate 15 (FIG. 4) is formed of the silicon substrate 10, the silicon oxide layer 12, and the crystalline silicon substrate 14.

Field effect transistors such as MOSFETs, which are fabricated in the upper silicon layer of a SOI structure, such as the SOI substrate 15 of FIG. 4, are known in the art. Typically, MOSFETs are fabricated by placing an undoped polycrystalline material, for example polysilicon, over a relatively thin gate oxide, and implanting the polycrystalline material and adjacent active regions with an impurity dopant material to form source and drain regions. If the impurity dopant material for forming the source/drain regions is n-type, then the resulting MOSFET is an NMOSFET ("NMOS") device. Conversely, if the impurity dopant material for forming the source/drain regions is p-type, then the resulting MOSFET is a PMOSFET ("PMOS") device.

Field effect transistors fabricated in the upper silicon layer of a SOI structure, such as the SOI substrate 15 of FIG. 4, have multiple advantages over the transistors fabricated on the conventional bulk silicon substrates. These advantages include, among others, resistance to short-channel effect, increased current drive, higher packing density, and reduced parasitic capacitance. However, despite all these attractive properties, SOI technology still has some drawbacks, which reduce the benefits of using it for high-performance and high-density ultra large scale integrated (ULSI) circuits.

One drawback of the SOI technology is the conductivity of the top silicon layer and its inherent floating body effect, which has particular significance for partially-depleted (PD) or non-fully depleted SOI devices. The floating body effect in such devices occurs as a result of the buried oxide that isolates the channel region of such device and allows charge carriers to build up in the channel region. In a partially-depleted MOSFET, charge carriers (holes in an nMOSFET and electrons in a pMOSFET), generated by impact ionization and drain junction leakage near the drain/body region, accumulate near the source/body region of the transistor. When sufficient carriers accumulate, they are stored in the floating body, which is formed right below the channel region, and alter the floating body potential. As a result, kinks in the I/V curve occur, the threshold voltage is lowered, the dynamic data retention time is altered, and the overall electrical performance of the device may be severely degraded.

One technique for diminishing the negative effects of the charge build up has been to provide an extra electrical connection by adding a contact to the body for hole current collection. However, the currently available hole collection schemes, such as the use of a side-contact, are inefficient, require very complex processing steps, and consume a great amount of device area.

Another technique for diminishing the negative effects of the charge build up has been to use a fully depleted (FD) SOI MOSFET. For this, the silicon layer or island must be sufficiently thin, less than about 400 Angstroms for state-of-the art technology, so that the entire thickness of the body region is depleted of majority carriers and both junctions are at ground. Unfortunately, silicon islands of less than 400 Angstroms thick are extremely costly and difficult to manufacture, due primarily to the sensitivity to variations of silicon film thickness and doping profile across the wafer, as well as to the large source/drain parasitic resistance. In addition, the low threshold voltage ($V_T$) of a conventional fully depleted (FD) SOI causes large subthreshold leakage and low subthreshold voltage ($V_t$), which in turn greatly reduce the static retention time of a DRAM.

Accordingly, there is a need for an improved method for forming a fully-depleted SOI device having reduced charge build up and accompanying threshold voltage changes and charge leakage. There is also a need for an integrated memory process for SOI wafer fabrication in which access transistors are created with fewer processing steps and which saves wafer area. A defect-free fully-depleted SOI device which is highly immune to soft errors (due to alpha particles and cosmic ray irradiation) is also needed.

SUMMARY OF THE INVENTION

The present invention provides a fully-depleted (FD) Silicon-on-Insulator (SOI) MOSFET device, for example, a FD SOI NMOS access transistor, with high threshold voltage and reduced leakage. The present invention also provides a simple method for forming a fully-depleted (FD) Silicon-on-Insulator (SOI) MOSFET device on a SOI substrate, which does not require an additional silicon thinning process which is typical for the formation of such fully-depleted (FD) Silicon-on-Insulator (SOI) MOSFET devices.

The fully-depleted (FD) Silicon-on-Insulator (SOI) MOSFET device of the present invention comprises a gate electrode of a conductivity type which is opposite the conductivity type of the source/drain regions. For example, a FD SOI NMOS access transistor formed in the memory array area of a SOI substrate according to the present invention comprises a p+ gate electrode and n+ source and drain regions. The p+ gate electrode ensures the filly-depleted working mode of the SOI NMOS device.

The present invention also provides at least one fully-depleted (FD) SOI MOSFET device of a first conductivity type in a memory array area of a SOI substrate, and at least one partially-depleted (PD) SOI MOSFET device of the same conductivity type in a periphery area of the SOI substrate. The fully-depleted (FD) SOI MOSFET device of the first conductivity type comprises a gate electrode of a second conductivity type which reduces the charge build up and the leakage current.

The present invention further provides a method of forming at least one partially-depleted (PD) SOI MOSFET device of a first conductivity type in a periphery area of a SOI substrate, while at least one fully-depleted (FD) SOI MOSFET device of the first conductivity type is formed in a memory array area of the SOI substrate. According to the present invention, the gate electrode of the filly-depleted (FD) SOI MOSFET device of the first conductivity type formed in the memory array area is doped with dopants of a second conductivity type to guarantee the fully-depleted working mode for the access SOI MOSFET in the memory array area. The fully-depleted (FD) SOI MOSFET device of the present invention is fabricated on a SOI substrate which does not have to undergo an extra a silicon thinning process which is typically required for the formation of such filly-depleted (FD) SOI MOSFET devices.

The above and other advantages and features of the present invention will be more clearly understood from the following detailed description which is provided in connection with the accompanying drawings.

DETAILED DESCRIPTION OF THE PREFERRED EMBODIMENTS

Figure 1:
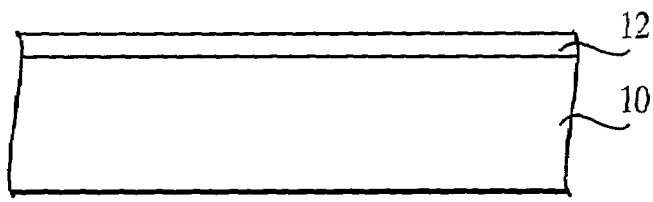
FIG. 1 is a cross-sectional view of a SOI substrate at an initial stage of processing and in accordance with a method of the prior art.
Figure 2:
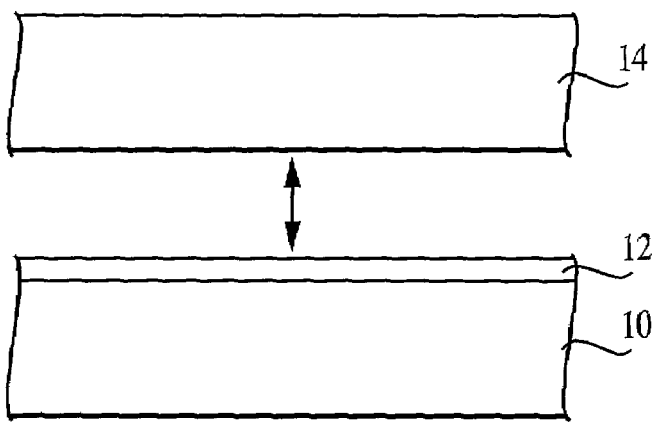
FIG. 2 is a cross-sectional view of the SOI substrate of FIG. 1 at a stage of processing subsequent to that shown in FIG. 1.
Figure 3:
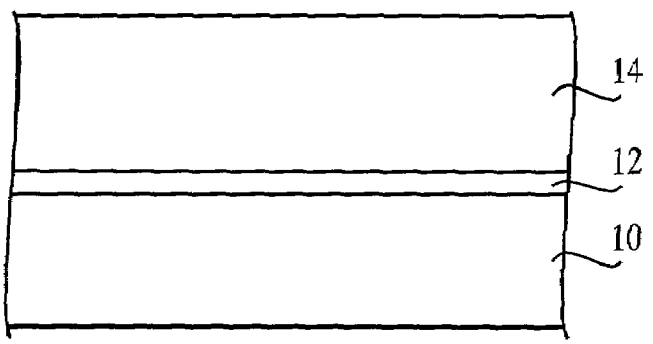
FIG. 3 is a cross-sectional view of the SOI substrate of FIG. 1 at a stage of processing subsequent to that shown in FIG. 2.
Figure 4:
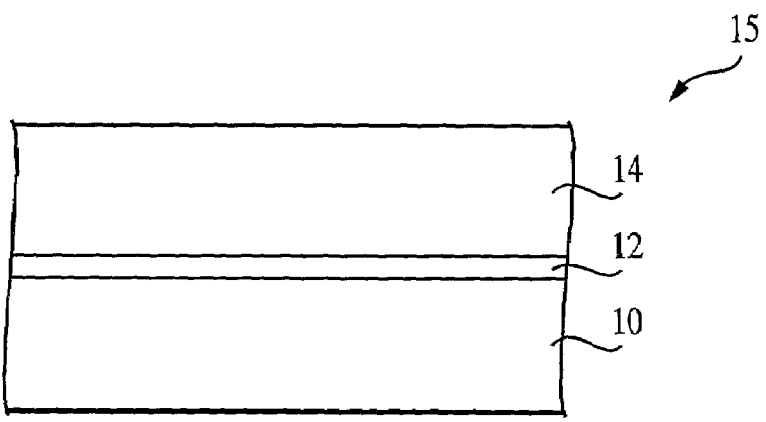
FIG. 4 is a cross-sectional view of the SOI substrate of FIG. 1 at a stage of processing subsequent to that shown in FIG. 3.

In the following detailed description, reference is made to various specific embodiments in which the invention may be practiced. These embodiments are described with sufficient detail to enable those skilled in the art to practice the invention, and it is to be understood that other embodiments may be employed, and that various structural, logical, and electrical changes may be made without departing from the spirit or scope of the invention.

The present invention provides a method of forming at least one partially-depleted (PD) SOI MOSFET device of a first conductivity type in a periphery area of a SOI substrate, while at least one fully-depleted (FD) SOI MOSFET device of the first conductivity type is formed in a memory array area of the SOI substrate. According to the present invention, the gate electrode of the fully-depleted (FD) SOI MOSFET device of the first conductivity type formed in the memory array area is doped with impurity atoms of a second conductivity type to guarantee the filly-depleted working mode for the access SOI MOSFET in the memory array area.

This way, the fully-depleted (FD) Silicon-on-Insulator (SOI) MOSFET device of the present invention has reduced leakage without reducing the threshold voltage, and is fabricated without extra thinning of silicon, which is typically required for the formation of such fully-depleted (FD) Silicon-on-Insulator (SOI) MOSFET devices.

Referring now to the drawings, where like elements are designated by like reference numerals, FIGS. 5–19 illustrate a method for the fabrication of both a partially-depleted (PD) SOI MOSFET 200 (FIG. 19) and a fully-depleted (FD) SOI MOSFET 100 (FIG. 19) of the same conductivity type and on the same silicon film. As described in detail below, the partially-depleted (PD) NMOS transistor 200 (FIG. 19) and the fully-depleted (FD) SOI NMOS transistor 100 (FIG. 19) comprising a p+ gate electrode 60*a* (FIGS. 17–19) are both formed on the same SOI substrate 40. Thus, the present invention eliminates the need for an extra silicon thinning process conventionally employed in the formation of a fully-depleted (FD) SOI MOSFET.

Although the present invention will be described below with reference to the formation of two NMOS transistors each in their respective periphery and memory array regions of a SOI substrate, such as the partially-depleted (PD) NMOS transistor 200 (FIG. 19) and the filly-depleted (FD) SOI NMOS transistor 100 (FIG. 19), it must be understood that the invention is not limited to this embodiment. Accordingly, the invention also contemplates the formation of PMOS transistors in both the periphery and memory access regions, as well as the formation of a plurality of fully-depleted (FD) and partially-depleted (PD) transistors of the same or different conductivity type. In addition, although the partially-depleted (PD) NMOS transistor 200 (FIG. 19) and the fully-depleted (FD) SOI NMOS transistor 100 (FIG. 19) are illustrated as being adjacent in the drawings, in actual practice this will likely not occur, as FD SOI NMOS transistor 100 is formed in a memory array area of a memory device and PD SOI NMOS transistor 200 is formed in a peripheral logic area outside the memory array area. Thus, the below illustrated and described embodiments are only exemplary, and the present invention is not limited to the illustrated embodiments.

Figure 5:
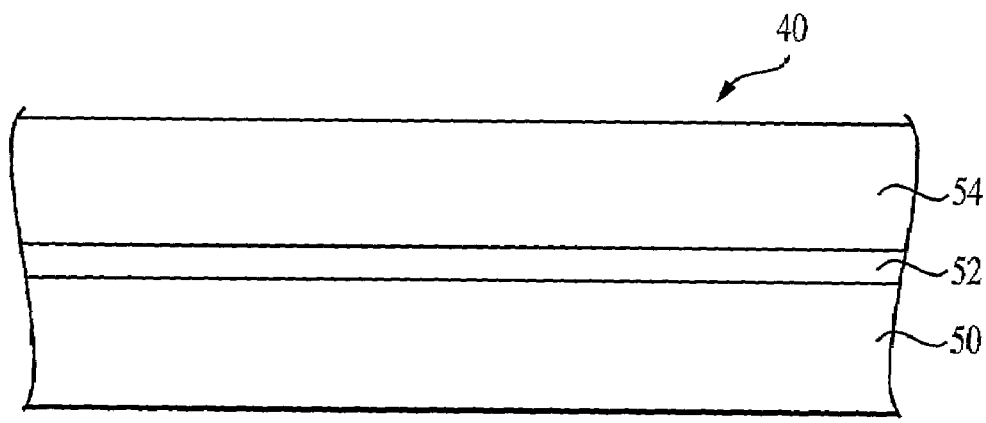
FIG. 5 is a cross-sectional view of a portion of a SOI substrate at an initial stage of processing on which a PD SOI NMOS device and a FD SOI NMOS device will be fabricated in accordance with an embodiment of the present invention.

FIG. 5 illustrates a silicon-on-insulator (SOI) substrate 40 formed, for example, by a SIMOX, BESOI or ZMR technique. The SOI substrate 40 comprises a first silicon substrate 50 and an insulating layer 52, for example, a buried silicon oxide insulating layer 52. The SOI substrate 40 of FIG. 5 also comprises a second silicon substrate 54.

Although reference to the thermally grown insulating layer 52 (FIG. 5) will be made in this application as to the silicon dioxide layer 52 or the buried silicon oxide layer 52, it must be understood that the present invention has applicability to other types of thermally grown insulating oxides. Thus, the present invention is not limited to silicon oxides, and other oxides, such as a oxynitrides and saphire-intermediate oxides grown by chemical vapor deposition (CVD), may be used also in accordance with the characteristics of the particular SOI device. Similarly, although the present invention is explained with reference to silicon substrates, such as the first and second silicon substrates 50, 54 (FIG. 5), it must be understood that the substrate need not be silicon-based. Thus, the invention has equal applicability to other semiconductor substrates, such as, for example, silicon-germanium, germanium, silicon-on-saphire, or gallium-arsenide substrates.

Figure 6:
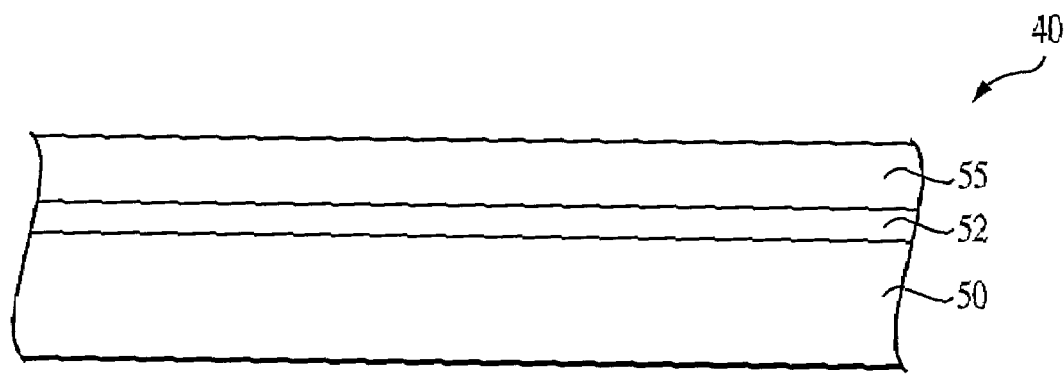
FIG. 6 is a cross-sectional view of the SOI substrate of FIG. 5 at a stage of processing subsequent to that shown in FIG. 5.

Referring now to FIG. 6, the thickness of the second silicon substrate 54 is reduced by thermal oxidation, for example, to achieve a thin silicon layer 55 of about 200 Angstroms to about 1,500 Angstroms, more preferably of about 300 Angstroms to about 1,200 Angstroms. During the thermal oxidation process, the top surface (not shown) of the silicon material of the second silicon substrate 54 is oxidized to form a silicon oxide layer (not shown) which is subsequently removed, by wet etch for example, to form the thin silicon layer 55 (FIG. 6).

According to the present invention and as explained in more detail below, the thin silicon layer 55 need not have a thickness less than about 500 Angstroms, which is required for the body region to be fully depleted of majority carriers when the SOI MOSFET device is in the "on" state and both junctions are at ground. Thus, in the embodiments described below, fully-depleted SOI MOSFET devices will be formed without an extra (or additional) silicon thinning process, that is, without further reducing the thickness of the silicon layer 55, which is of about 500 Angstroms to about 1,500 Angstroms, to less than about 500 Angstroms.

Subsequent to the thinning process of the second silicon substrate 54 and the formation of the thin silicon layer 55 (FIG. 6), an isolation region 51 (FIG. 7) is formed in the thin silicon layer 55 by any known technique, such as thermal oxidation of the underlying silicon in a LOCOS process, or by etching trenches and filling them with a dielectric or an oxide material in an STI process. This way, the isolation region 51 (FIG. 7) may be a field oxide region (FOX) or a shallow trench for isolation (STI).

According to an exemplary embodiment of the present invention, the isolation region 51 (FIG. 5) is a shallow trench for isolation filled with high density plasma (HDP) oxide, a material which has a high ability to effectively fill narrow trenches. Alternatively, an insulating layer (not shown) formed of an oxide or of silicon nitride, for example, may be formed on the trench sidewalls, prior to filling the trench with the isolation dielectric, to aid in smoothing out the corners in the bottom of the trench and to reduce the amount of stress in the dielectric used to later fill in the trench.

Figure 7:
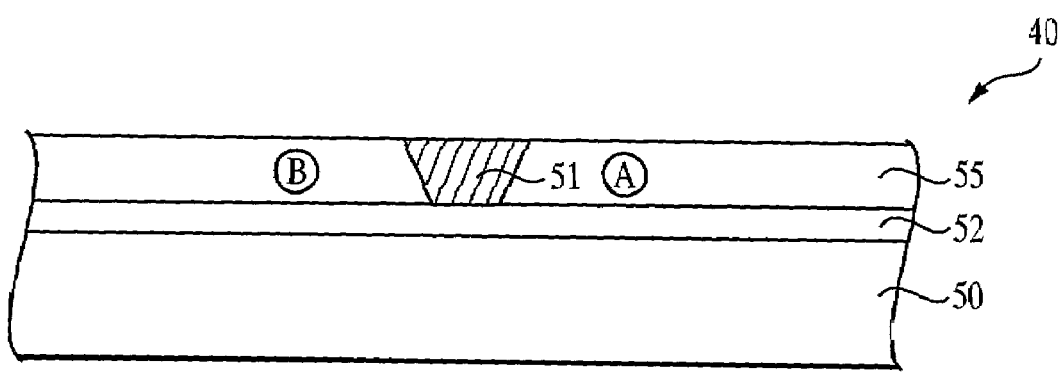
FIG. 7 is a cross-sectional view of the SOI substrate of FIG. 5 at a stage of processing subsequent to that shown in FIG. 6.

As known in the art, the isolation region 51 provides electrical and physical separation, as well as isolation between neighboring transistor regions on the SOI substrate 40. As illustrated in FIG. 7, the isolation region 51 isolates region A of the thin silicon layer 55 on which memory access circuitry will be subsequently formed, from region B of the thin silicon layer 55 on which peripheral circuitry will be subsequently formed, all according to embodiments of the present invention.

Figure 8:
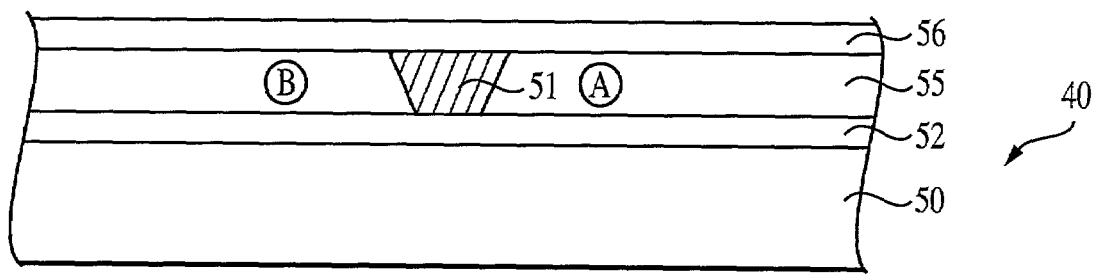
FIG. 8 is a cross-sectional view of the SOI substrate of FIG. 5 at a stage of processing subsequent to that shown in FIG. 7.

Subsequent to the formation of the isolation region 51 (FIG. 7), a thin gate oxide layer 56, which will act as a gate insulator layer, is formed over the thin silicon layer 55, as shown in FIG. 8. The thin gate oxide layer 56 may comprise silicon dioxide ($SiO_2$), for example, which may be thermally grown in an oxygen ambient, at a temperature between about 600° C. to about 1000° C. and to a thickness of about 10 Angstroms to about 100 Angstroms. The gate insulator is not limited to silicon oxide and other dielectric materials such as oxynitride, $Al_2O_3$, $Ta_2O_5$ or other high k material may be used as gate insulator layer.

Figure 9:
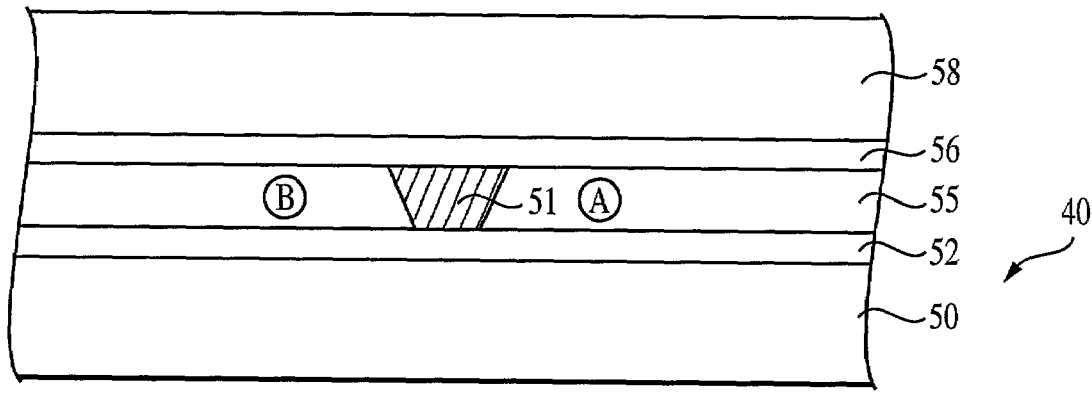
FIG. 9 is a cross-sectional view of the SOI substrate of FIG. 5 at a stage of processing subsequent to that shown in FIG. 8.
Figure 10:
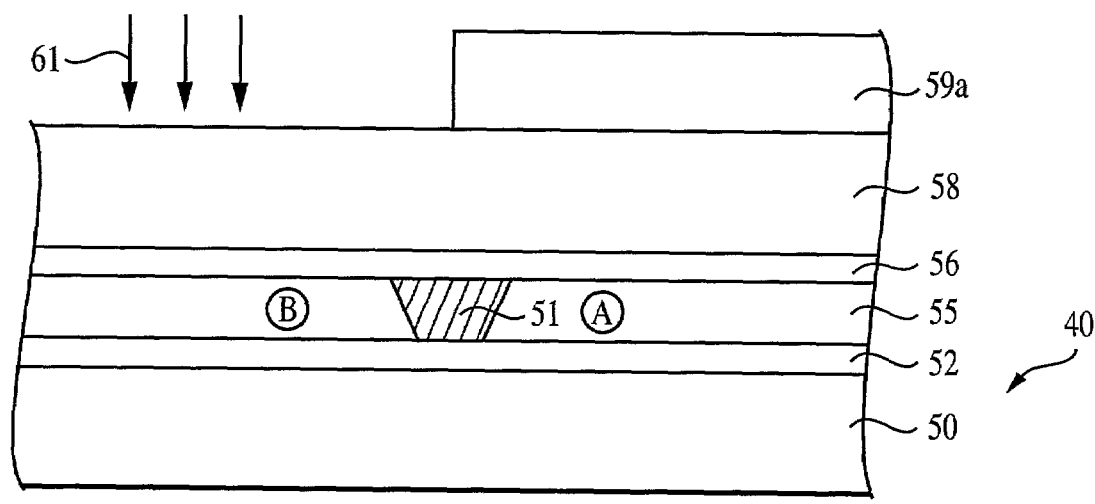
FIG. 10 is a cross-sectional view of the SOI substrate of FIG. 5 at a stage of processing subsequent to that shown in FIG. 9.

As illustrated in FIG. 9, an undoped gate layer 58 is formed over the thin gate oxide layer 56. According to an embodiment of the present invention, the undoped gate layer 58 is formed of polysilicon which may be deposited over the thin gate oxide layer 56 by, for example, a low plasma chemical vapor deposition (LPCVD) method at a temperature of about 300° C. to about 700° C. and to a thickness of about 100 Angstroms to about 2,000 Angstroms.

According to another embodiment of the present invention, the undoped gate layer 58 is a layer of silicon/ germanium (Si/Ge) material. According to this embodiment, the gate silicon/germanium layer 58 is grown by a low plasma chemical vapor deposition (LPCVD) method in a reaction chamber at a temperature of about 900° C. to about 1200° C., and by employing a silicon (Si) and germanium (Ge) gas source to introduce a gaseous species containing silicon and germanium in the same reaction chamber.

The silicon gas source may be, for example, silane ($SiH_4$), higher order silanes, such as disilane ($Si_2H_6$), as well as other gaseous sources of silicon, such as dichlorsilane ($SiH_2Cl_2$), trichlorsilane ($SiHCl_3$), or tetrachlorsilane ($SiCl_4$). The germanium gas source may be, for example, a germane ($GeH_4$) source, or any other gaseous source containing germanium. The combination of the two gaseous sources allows deposition of the gate silicon/germanium layer 58 to a thickness of about 100 Angstroms to about 1500 Angstroms, more preferably of about 500 Angstroms to about 900 Angstroms. The gate silicon/germanium layer 58 has a germanium composition of approximately 0–100% of the total composition, more preferably of about 15–50%. The thickness of the gate silicon/germanium layer 58 is proportional to, and depends upon, the deposition time. Although, as described above, the undoped gate layer 58 may be formed of various materials, reference to the undoped gate layer 58 will be made in this application as to the undoped polysilicon layer 58. However, the invention also encompasses embodiments with a metal gate, for example, TiN, Ti, Ni, Mo and TaNx among others, with appropriate work functions and which can be used similarly to the N/P+ poly gate approach.

Subsequent to the formation of the undoped polysilicon layer 58 (FIG. 9), a first patterned photoresist layer 59a (FIG. 10) is formed to a thickness of about 1,000 Angstroms to about 10,000 Angstroms over the undoped polysilicon layer 58 and the region A, but not over the region B on which periphery circuitry will be subsequently formed according to a method of the present invention. Thus, using the thick patterned photoresist layer 59a as a mask, dopant or impurity atoms of a first conductivity type are introduced into the exposed portion of the undoped polysilicon layer 58 located above the region B of the SOI substrate 40 by using a first ion implantation 61 (FIG. 10) to form a doped polysilicon layer 60b, illustrated in FIG. 11.

Figure 11:
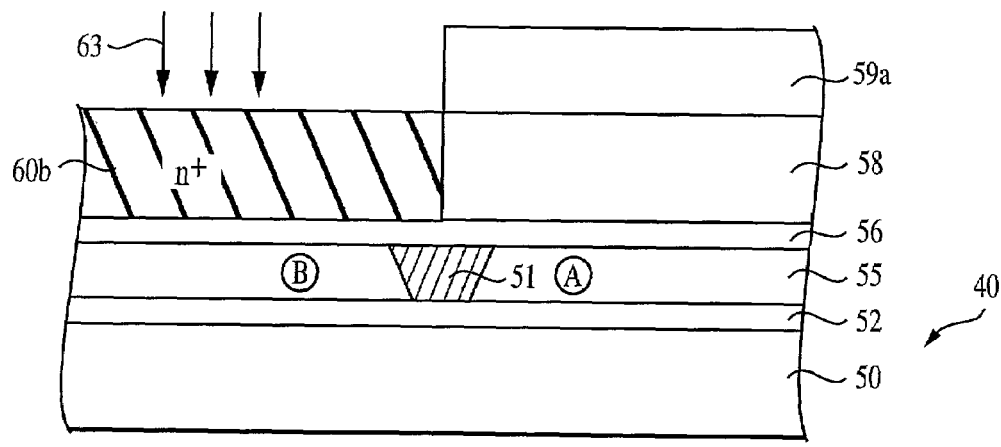
FIG. 11 is a cross-sectional view of the SOI substrate of FIG. 5 at a stage of processing subsequent to that shown in FIG. 10.

According to an exemplary embodiment of the invention, the dopant or impurity atoms of the first conductivity type are of n-type conductivity for NMOS device fabrication. Thus, n-type dopants such as phosphorous (P), arsenic (As) or antimony (Sb) are implanted into the exposed region of the undoped polysilicon layer 58 by using the first ion implantation 61 (FIG. 10) to form the n+ doped polysilicon layer 60b (FIG. 11). Ion implantation is performed by placing the SOI substrate 40 in an ion implanter, for example, and implanting appropriate dopant ions into the exposed portion of the undoped polysilicon layer 58. For example, phosphorous is introduced into the exposed portion of the undoped polysilicon layer 58 of FIG. 10 using ion implantation at an accelerated energy of about 1 keV to about 50 keV and a dose concentration of about $1\times10^{15}/cm^2$ to about $5\times10^{15}/cm^2$. A heat treatment such as an anneal treatment at about 600° C. to about 1000° C., may be optionally employed to activate the dopant within the n+ doped polysilicon layer 60b of FIG. 11.

Figure 12:
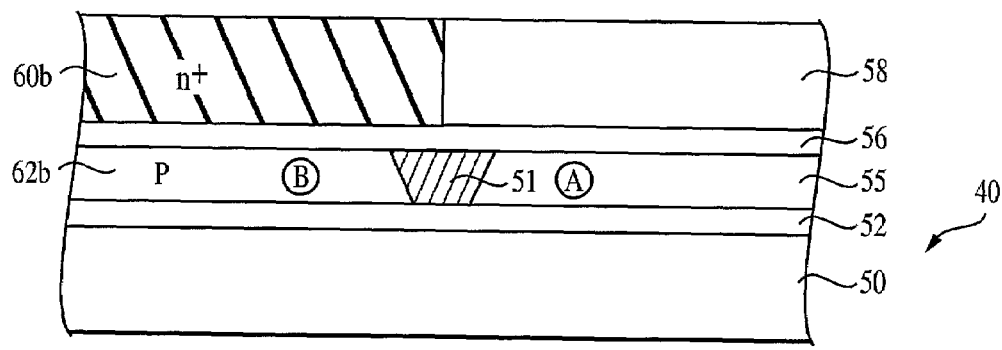
FIG. 12 is a cross-sectional view of the SOI substrate of FIG. 5 at a stage of processing subsequent to that shown in FIG. 11.

Subsequent to the formation of the n+ polysilicon layer 60b of FIG. 11, the SOI substrate 40 undergoes a second ion implantation 63 (FIG. 11) using the first patterned photoresist layer 59a as a mask, this time with dopant impurity ions of a second conductivity type. In this manner, p-type dopant impurity ions, such as boron (B), boron fluoride ($BF_2$) or indium (In) are implanted into the thin silicon layer 55 to form a p-type well 62b as shown in FIG. 12. Ion implantation is performed by placing the SOI substrate 40 in an ion implanter, for example, and implanting appropriate p-type dopant ions into the thin silicon layer 55 located above the region B of the SOI substrate 40. For example, boron is introduced into the thin silicon layer 55 of FIG. 11 using ion implantation at an accelerated energy of about 15 keV to about 150 keV and a dose concentration of about $1\times10^{11}/cm^2$ to about $5\times10^{13}/cm^2$. A heat treatment, for example, an anneal treatment at about 600° C. to about 1000° C., may be optionally employed to activate the dopant within the doped p well 62b of FIG. 12.

Although the invention has been described above with reference to the formation of the p well 62b (FIG. 12) subsequent to the formation of the n+ polysilicon layer 60b (FIG. 11), the invention is not limited to this exemplary embodiment. As such, the invention also contemplates the formation of the p well 62b first, and then followed by the formation of the n+ polysilicon layer 60b.

Figure 13:
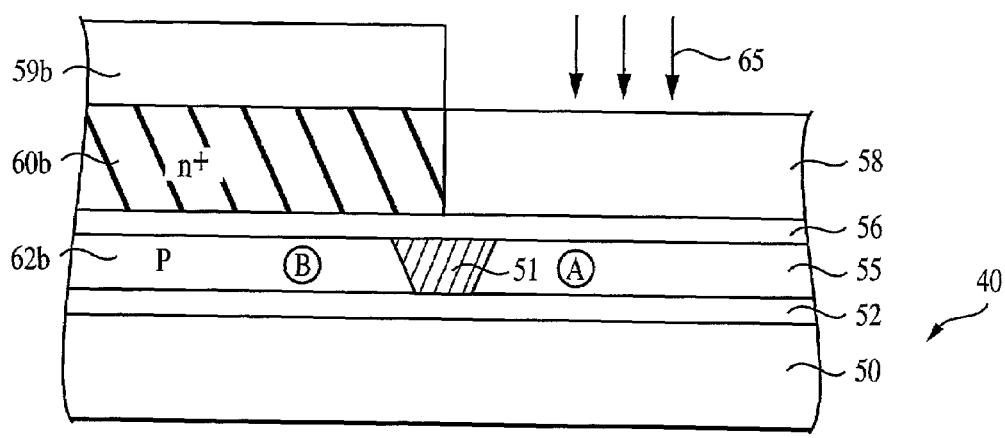
FIG. 13 is a cross-sectional view of the SOI substrate of FIG. 5 at a stage of processing subsequent to that shown in FIG. 12.

Referring now to FIG. 13, a second patterned photoresist layer 59b is formed to a thickness of about 1,000 Angstroms to about 10,000 Angstroms over the n+ doped polysilicon layer 60b and the p doped well 62b, but not over the region A on which memory access circuitry will be subsequently formed according to a method of the present invention. Accordingly, using the thick patterned photoresist layer 59b as a mask, dopant or impurity atoms of the second conductivity type are introduced into the exposed portion of the undoped polysilicon layer 58 located above the region A of the SOI substrate 40 to form a p+ doped polysilicon layer 60a, as illustrated in FIG. 14.

Figure 14:
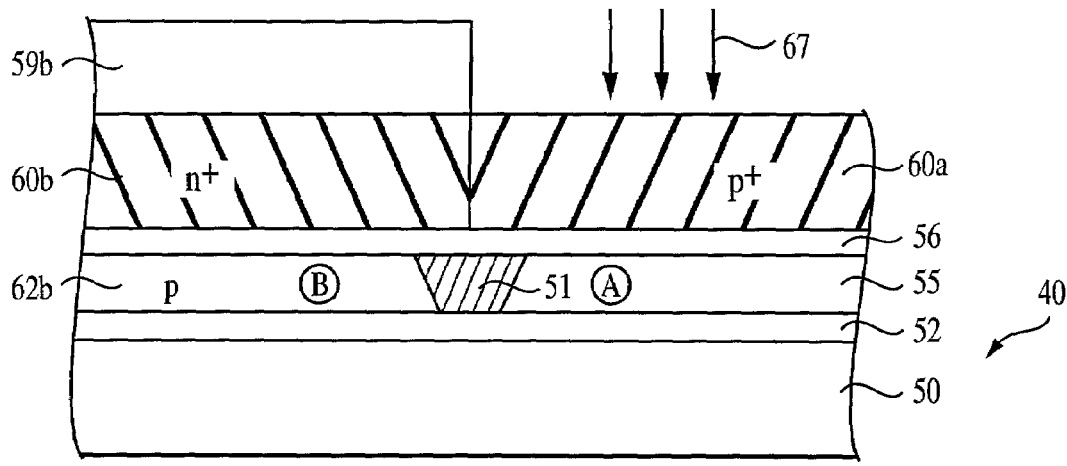
FIG. 14 is a cross-sectional view of the SOI substrate of FIG. 5 at a stage of processing subsequent to that shown in FIG. 13.

P-type dopant impurity ions, such as boron (B), boron fluoride ($BF_2$) or indium (In) are implanted into the exposed region of the undoped polysilicon layer 58 of FIG. 13 by using a third ion implantation 65 (FIG. 13) to form the p+ doped polysilicon layer 60a (FIG. 14). Ion implantation is performed by placing the SOI substrate 40 in an ion implanter, and implanting appropriate dopant ions into the exposed portion of the undoped polysilicon layer 58. For example, boron is introduced into the exposed portion of the undoped polysilicon layer 58 of FIG. 13 using ion implantation at an accelerated energy of about 1 keV to about 50 keV and a dose concentration of about $1\times10^{15}/cm^2$ to about $5\times10^{15}/cm^2$. A heat treatment, for example, an anneal treatment at about 600° C. to about 1000° C., may be optionally employed to activate the dopant within the p+ doped polysilicon layer 60a of FIG. 14.

Figure 15:
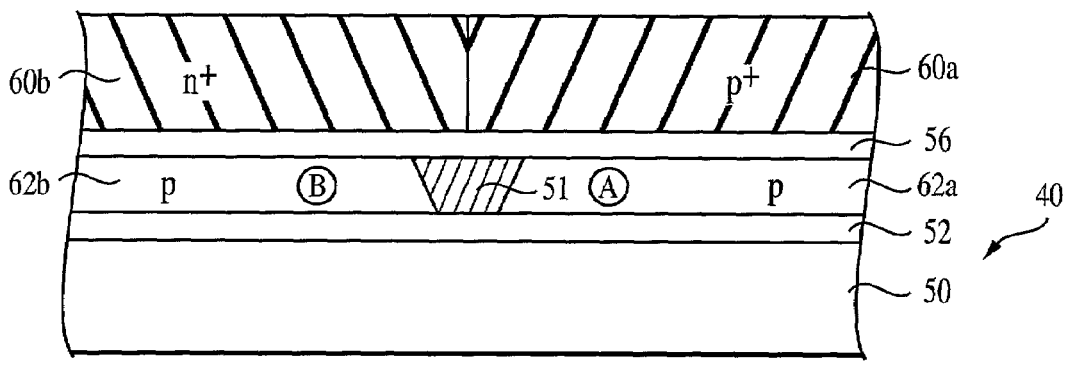
FIG. 15 is a cross-sectional view of the SOI substrate of FIG. 5 at a stage of processing subsequent to that shown in FIG. 14.

According to an embodiment of the invention and subsequent to the formation of the p+ polysilicon layer 60a of FIG. 14, the SOI substrate 40 may optionally undergo a fourth ion implantation 67 (FIG. 14) to form a lightly doped or very lightly doped p-type well 62a illustrated in FIG. 15. For the purposes of the present invention, "light doping" is defined as doping with a dose concentration of about $1\times10^9/cm^2$ to $1\times10^{12}/cm^2$, more preferably of about $1\times10^{10}/cm^2$ to $5\times10^{11}/cm^2$. Lightly doping the thin silicon layer 55 to form the p-type well 62a of the SOI substrate 40 is optional, as the p+ polysilicon layer 60a (which will form p+ gate electrode 60a of FIG. 17) has a large workfunction and can confer a threshold voltage of about 1.0V even without the lightly doping of the silicon layer.

In an exemplary embodiment of the invention, the thin silicon layer 55 corresponding to the region A of the SOI substrate 40 undergoes a light doping using the second patterned photoresist layer 59b as a mask, with dopant impurity ions of the second conductivity type. In this manner, p-type dopant impurity ions, such as boron (B), boron fluoride (BF$_2$) or indium (In) are implanted into the thin silicon layer 55 corresponding to region A (FIG. 14) to form a lightly-doped p-type well 62a as shown in FIG. 15.

Ion implantation is performed by placing the SOI substrate 40 in an ion implanter, for example, and implanting appropriate light doses of p-type dopant ions into the thin silicon layer 55 corresponding to the region A of the SOI substrate 40. For example, boron is introduced into the thin silicon layer 55 of FIG. 14 using ion implantation at an accelerated energy of about 1 keV to about 60 keV and a light dose concentration of about $1\times10^{11}$/cm$^2$. A heat treatment, for example, an anneal treatment at about 600° C. to about 1000° C., may be optionally employed to activate the dopant within the lightly-doped p+ well 62a of FIG. 15.

Although the invention has been described above with reference to the formation of the p well 62a (FIG. 15) subsequent to the formation of the p+ polysilicon layer 60a (FIG. 14), the invention is not limited to this exemplary embodiment. As such, the invention also contemplates the formation of the p well 62a first, and then followed by the formation of the p+ polysilicon layer 60a.

Figure 16:
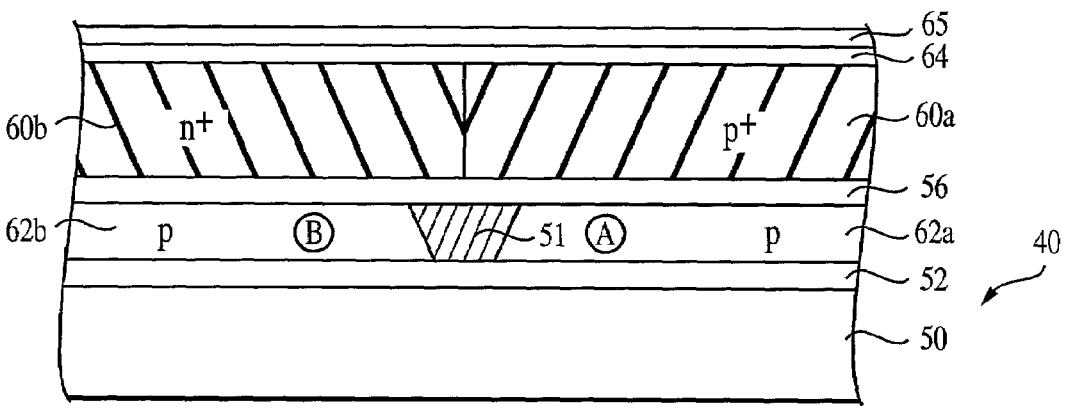
FIG. 16 is a cross-sectional view of the SOI substrate of FIG. 5 at a stage of processing subsequent to that shown in FIG. 15.
Figure 17:
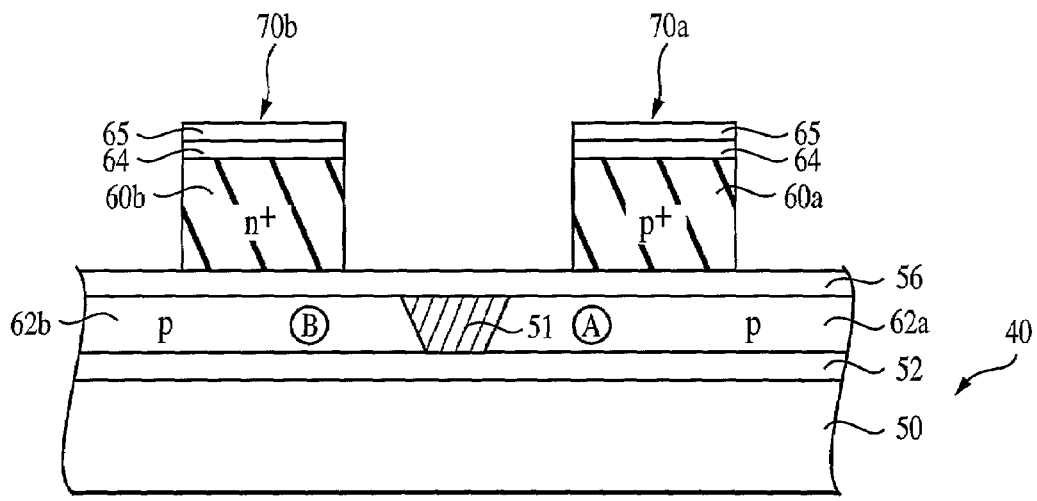
FIG. 17 is a cross-sectional view of the SOI substrate of FIG. 5 at a stage of processing subsequent to that shown in FIG. 16.

Referring now to FIG. 16 and in accordance with an exemplary embodiment of the present invention, silicide regions 64 may be formed over the doped polysilicon layers 60a, 60b (FIG. 15). If the silicide regions are desired, a layer of metal capable of forming a silicide may be deposited over the doped polysilicon layers 60a, 60b (FIG. 15) by sputtering by RF or DC or by other similar methods such as CVD, to a thickness of about 100 Angstroms to about 800 Angstroms. Subsequent to the deposition of the metal capable of forming a silicide, the SOI substrate 40 undergoes a rapid thermal anneal (RTA), typically for about 10 to 60 seconds, using a nitrogen ambient at about 600° C. to about 850° C., so that the metal in direct contact with the doped polysilicon layers 60a, 60b is converted to its silicide. As shown in FIG. 16, silicide regions 64 form conductive regions on top of the doped polysilicon layers 60a, 60b. Preferably, the refractory metal has low resistance and low resistivity as a silicide. However, the refractory metal silicide may comprise any refractory metal, including but not limiting to titanium, cobalt, tungsten, tantalum, molybdenum, and platinum.

Although the following processing steps for the completion of the gate stacks 70a, 70b (FIG. 17) will refer to and illustrate the silicide regions 64 formed over the doped polysilicon layers 60a, 60b, it must be understood that the present invention is not limited to this embodiment, and other embodiments such as the formation of gate stacks without a silicide layer on the polysilicon gate, are also contemplated. In any event, a cap material 65 is formed over the silicide regions 64, as also illustrated in FIG. 16. The cap material may be formed of silicon dielectrics such as silicon nitride or silicon oxide, but TEOS or carbides may be used also. The cap material 60 may be formed via PECVD and LPCVD deposition procedures, for example, at a temperature between about 300° C. to about 1000° C., to a thickness of about 500 Angstroms to about 2,000 Angstroms.

Next, the structure of FIG. 16 is patterned with a photoresist layer and a mask which are both formed over the cap material 65. In this manner, the doped polysilicon layers 60a, 60b, the optional silicide region 64 and the cap material 65 are anisotropically etched through the patterned photoresist, to obtain a plurality of polysilicon gates 70a, 70b, illustrated in FIG. 17. Each of the gate stacks 70a, 70b comprises a polysilicon layer, the optional silicide region 64 and the nitride cap 65. Gate 70b comprises the n+ doped polysilicon layer 60b, while gate 70a comprises the p+ doped polysilicon layer 60a.

Figure 18:
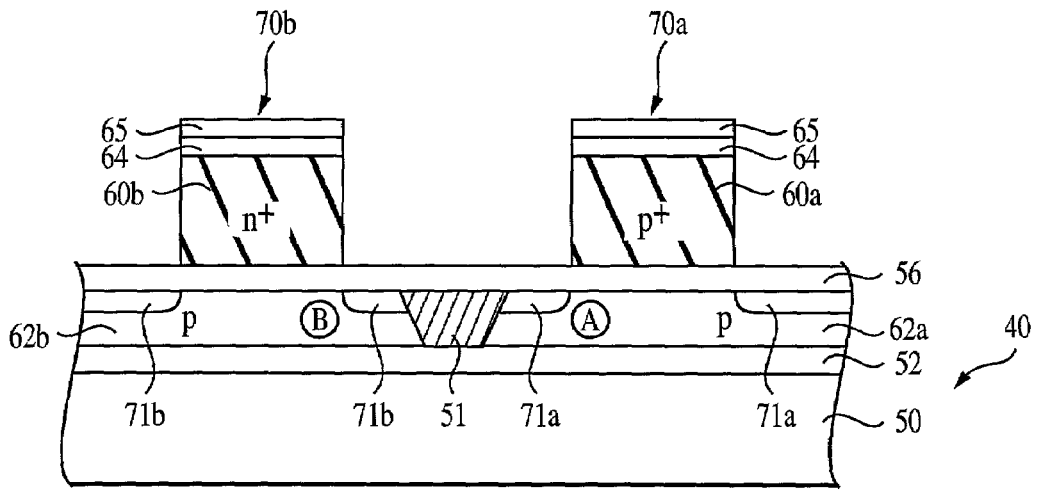
FIG. 18 is a cross-sectional view of the SOI substrate of FIG. 5 at a stage of processing subsequent to that shown in FIG. 17.

The gate stacks 70a, 70b may now be used in a self-aligned implant process where the gate stacks mask the dopant implantation of source/drain regions 73a, 73b (FIG. 19) of the adjacent transistors defined by the gate stacks. As such, FIG. 18 illustrates the formation of lightly doped drain (LDD) regions 71a, 71b in the SOI substrate 40. As known in the art, the LDD regions 71a, 71b may be formed by implanting low dosages of conductivity-altering dopants with an LDD mask (not shown) and using the gate stacks 70a, 70b as an implantation mask. Thus, in the p well 62a of the region A of the SOI substrate 40, n-type dopants such as arsenic or phosphorous may be implanted at a low energy dose, for example of about $2\times10^{14}$ atoms/cm$^2$, using the gate stack 70a as a mask. Similarly, in the p well 62b of the region B of the SOI substrate 40, n-type dopants such as arsenic or phosphorous may be also implanted at a low energy dose, for example of about $2\times10^{14}$ atoms/cm$^2$, using the gate stack 70b as a mask.

Figure 19:
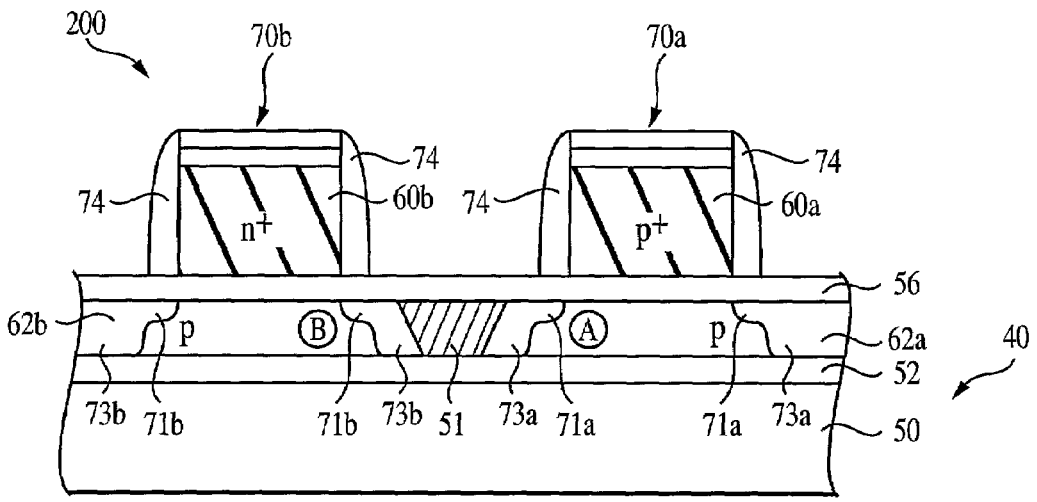
FIG. 19 is a cross-sectional view of the SOI substrate of FIG. 5 at a stage of processing subsequent to that shown in FIG. 18.

The next step in the process flow is the formation of spacers 74 illustrated in FIG. 19. Spacers 74 may be formed, for example, by blanket depositing a silicon nitride film or a silicon oxide material over the structure of FIG. 18 and then anisotropically etching it with an RIE plasma to form the spacers 74 on each of the sidewalls of the gate stacks 70a, 70b.

The gate stacks 70a, 70b protected by spacers 74 can now undergo processing steps for the formation of source/drain regions in the SOI substrate 40. As such, using the gate stacks 70a, 70b as an implantation mask, heavily doped source/drain regions 73a, 73b are formed in the uncovered portions of the SOI substrate 40 via an ion implantation procedure performed at an energy of about 3 KeV to about 50 keV, and at a dose of about $1\times10^{15}$ to about $5\times10^{15}$ atoms/cm$^2$, using an n-type dopant such as arsenic or phosphorous, for example. Thermal annealing for activation may be carried out in a nitrogen atmosphere at about 850° C. to about 1050° C. and for about 10 seconds to about 10 minutes.

This way, source and drain regions 73a, 73b (FIG. 19), which are heavily doped with n-type impurity ions, are formed within the p-type wells 62a, 62b. Thus, two n-p-n type (NMOS) transistors 100, 200 (FIG. 19) are formed of the gate stacks 70a, 70b and their respective n-type source/drain regions 73a, 73b within the p-type wells 62a, 62b. As explained in more detail below and with reference to FIG. 20, the first NMOS transistor 100 formed in the memory array area is a fully-depleted (FD) SOI NMOS transistor with a p+ gate electrode, as opposed to a conventional n+ gate electrode. The p+ gate electrode with low channel doping ensures the fully-depleted mode for the access SOI NMOS transistor 100 in the memory array. The second NMOS transistor 200 formed in the periphery area is a partially-depleted, and not fully-depleted, SOI NMOS transistor. Thus, a fully-depleted and a partially-depleted MOSFET devices of the same conductivity type are formed on the same SOI substrate and without the conventional silicon thinning of the silicon layer of the prior art to obtain a fully-depleted device.

Figure 20:
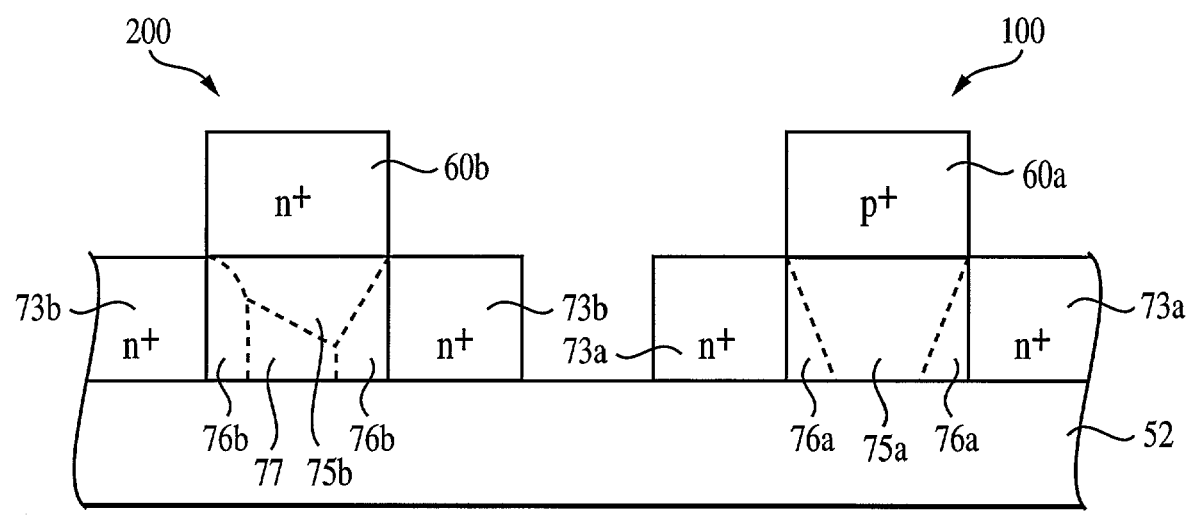
FIG. 20 illustrates schematically the partially-depleted and fully-depleted modes of the two NMOS devices of FIG. 19.

FIG. 20 illustrates schematically the depletion regions in the fully-depleted (FD) SOI NMOS transistor 100 having a p+ gate electrode and the partially-depleted (PD) SOI NMOS transistor 200 formed on the same SOI substrate. The partially-depleted (PD) SOI NMOS transistor 200 of FIG. 20 is called "partially-depleted" because depletion region 75b (FIG. 20) does not touch the buried oxide layer 52. Instead, neutral floating body region 77 of the partially-depleted (PD) SOI NMOS transistor 200 is interposed between the depletion region 75b and two junctions regions 76b (FIG. 20). In contrast, the fully-depleted (FD) SOI NMOS transistor 100 comprising a p+ gate electrode fabricated according to the present invention is called "fully-depleted" because depletion region 75a (FIG. 20) touches the buried oxide layer 52. Thus, as illustrated in FIG. 20, no neutral floating body region is interposed between the depletion region 75a and junction regions 76a (FIG. 20) of the fully-depleted (FD) SOI NMOS transistor 100. This is because the existence of the p+ doped polysilicon gate electrode 60a and the very low channel doping concentration confer a much larger depletion depth than the thickness of the silicon layer 62a.

Examples of the implementation of the present invention and of the characteristics of the p+ gate FD SOI NMOS transistor fabricated according to the present invention will now be described with reference to FIGS. 21–22.

Figure 21:
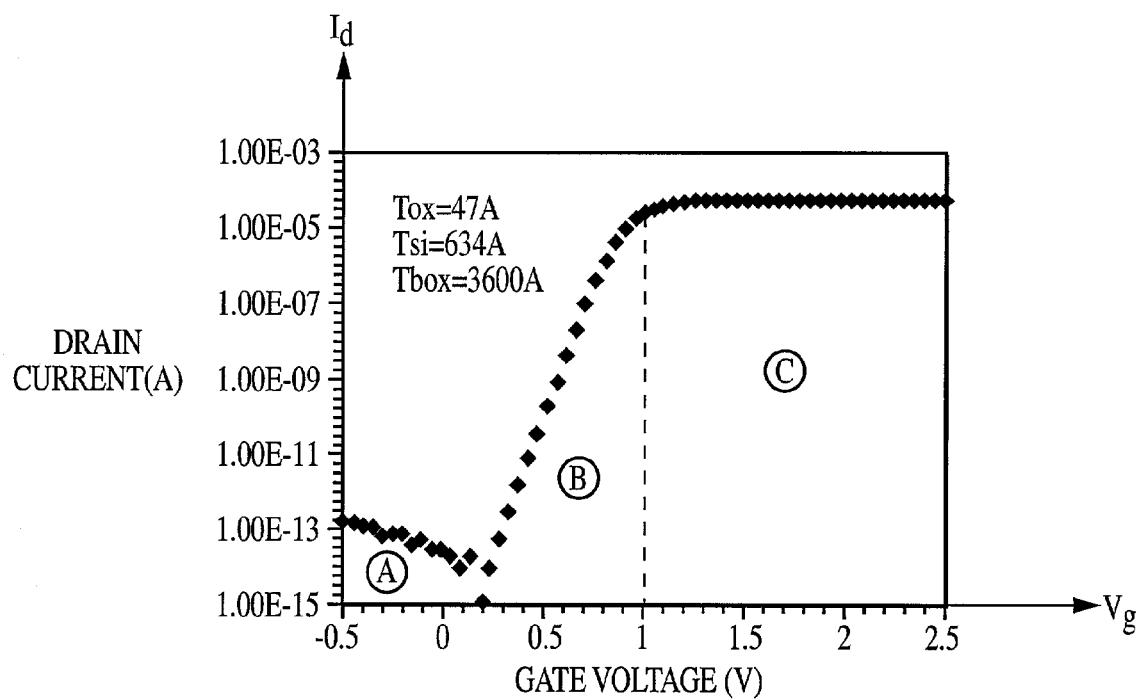
FIG. 21 is a graph illustrating the dependency of the drain current vs. gate voltage for a p+ gate FD SOI NMOS transistor fabricated according to an embodiment of the present invention.

FIG. 21 illustrates the dependency of the drain current (Id) versus the gate voltage (Vg) for a p+ gate fully-depleted (FD) SOI NMOS transistor fabricated according to an embodiment of the present invention. The p+ gate FD SOI NMOS transistor was fabricated on a SOI substrate comprising a buried oxide layer with a thickness of about 3600 Angstroms and an upper silicon layer with a thickness of about 634 Angstroms. The gate stack of the p+ gate FD SOI NMOS transistor comprised a thin gate oxide layer of about 47 Angstroms thick and a p+ doped polysilicon layer of about 750 Angstroms thick. The p+ doped polysilicon layer had a boron dopant concentration of about $3\times10^{15}/cm^2$. After the formation of the p+ doped polysilicon layer, the p+ gate FD SOI NMOS transistor underwent no p-well formation, as the channel doping concentration was equal to the intrinsic substrate concentration, of about $1\times10^{15}/cm^3$.

Measurements for the drain current and gate voltage were conducted on the p+ gate FD SOI NMOS transistor described above for a Vds (drain/source voltage) of about 0.05V. Data from the measurements was recorded and illustrated in FIG. 21. The distribution of the drain current (Id) as function of the gate voltage (Vg) of FIG. 21 demonstrates that the Id/Vg curve of the p+ gate FD SOI NMOS transistor of the present invention is similar to that of an n+ gate FD SOI NMOS transistor of the prior art.

For example, region A of FIG. 21 corresponds to gate voltage values in the range of about −0.5V to about 0.3V and drain current values in the range of about $10^{-15}$ A to about $10^{-13}$ A. For drain current and gate voltage values falling in the region A of FIG. 21, the p+ gate FD SOI NMOS transistor is in the "off" state. Similarly, region B of FIG. 21 corresponds to gate voltage values in the range of about 0.3V to about 1.0V and drain current values in the range of about $10^{-13}$ A to about $10^{-5}$ A. For drain current and gate voltage values falling in the region B of FIG. 21, the p+ gate FD SOI NMOS transistor begins to turn "on" and enters the sub-threshold mode. As shown in FIG. 21, the drain current of the p+ gate FD SOI NMOS transistor increases as the gate voltage increases. Finally, region C of FIG. 21 corresponds to gate voltage values in the range of about 1.0V to about 2.5V and drain current values of about $10^{-4}$ A. For drain current and gate voltage values falling in the region C of FIG. 21, the p+ gate FD SOI NMOS transistor is totally turned "on." As shown in FIG. 21, the drain current of the p+ gate FD SOI NMOS transistor increases as the gate voltage increases.

The measurements recorded in FIG. 21 demonstrate that the Id/Vg curve of the p+ gate FD SOI NMOS transistor fabricated according to an embodiment of the present invention follows the characteristics of an Id/Vg curve of an n+ gate FD SOI NMOS transistor of the prior art. Thus, good performance characteristics have been obtained for the p+ gate FD SOI NMOS transistor of the present invention without decreasing the thickness of the upper silicon layer of the SOI substrate and reducing threshold voltage.

Figure 22:
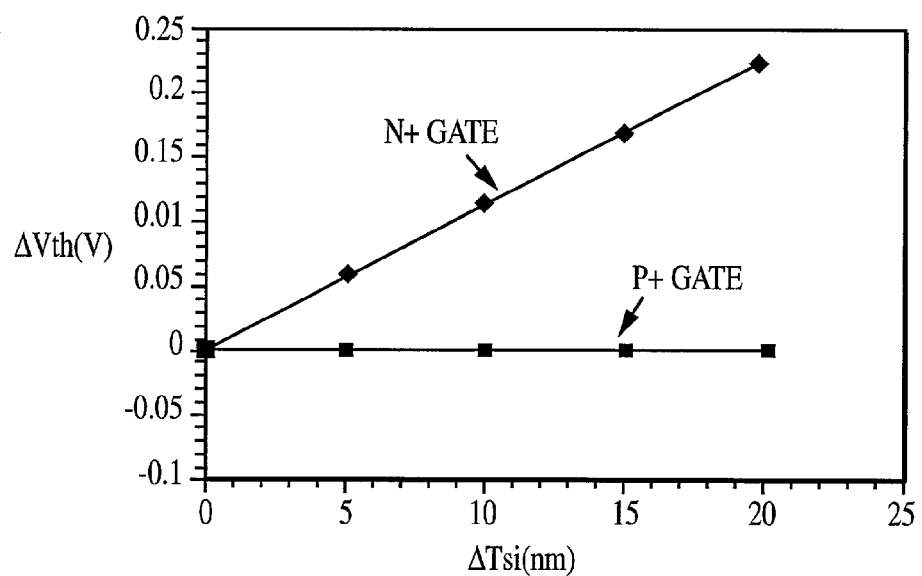
FIG. 22 is a simulated comparative graph illustrating the change of the threshold voltage vs. the change of silicon film thickness for an n+ gate FD SOI NMOS transistor of the prior art and a p+ gate FD SOI NMOS transistor fabricated of the present invention.

FIG. 22 is a simulated graph of the change in the threshold voltage ($\Delta$Vth) vs. change in the silicon thickness ($\Delta$Tsi) for 2 different NMOS transistors: a simulated n+ gate SOI NMOS transistor of the prior art (reference transistor) and a simulated p+ gate SOI NMOS transistor of the present invention. The simulation data was collected and gathered by a transistor simulator SILVACO. For the simulated n+ gate SOI NMOS transistor, the reference silicon film thickness was of about 25 nm at a reference threshold voltage of about 0.171V. For the simulated p+ gate SOI NMOS transistor, the reference silicon film thickness was of about 65 nm at a reference threshold voltage of about 0.90307V.

As known in the art, the threshold voltage of a SOI MOSFET device depends on changes in the silicon film thickness. Since the fully-depleted SOI NMOS transistor of the prior art requires a much thinner silicon film than the partially-depleted SOI NMOS transistor, the thickness of the silicon film varies across a wafer comprising a partially-depleted and a filly-depleted transistors. This change in the silicon film thickness causes, in turn, great threshold voltage variations. Accordingly, the characteristics of the fully-depleted SOI MOSFET devices of the prior art are greatly and undesirably impacted by the variations in the silicon film thickness.

FIG. 22 demonstrates that the threshold voltage of the simulated p+ gate SOI NMOS transistor of the present invention remains constant with the change in the silicon film thickness. Thus, the simulated p+ gate SOI NMOS transistor of the present invention is not vulnerable to variations in the silicon film thickness across the wafer. In contrast, the threshold voltage of the simulated n+ gate SOI NMOS transistor undesirably increases with the change in the silicon film thickness. The collected data demonstrates that the p+ gate SOI FD NMOS transistor is more manufacturable than the n+ gate SOI FD NMOS transistor because the characteristics of the p+ gate SOI NMOS transistor are not vulnerable to process variations.

The FD SOI NMOS transistor 100 (FIGS. 19–20) may be used as an access transistor in a memory device such as a random access memory device. For example, FIG. 23 illustrates a portion of a memory array area of the SOI substrate 40 on which a DRAM memory device 300 is formed in accordance with embodiments of the present invention.

Figure 23:
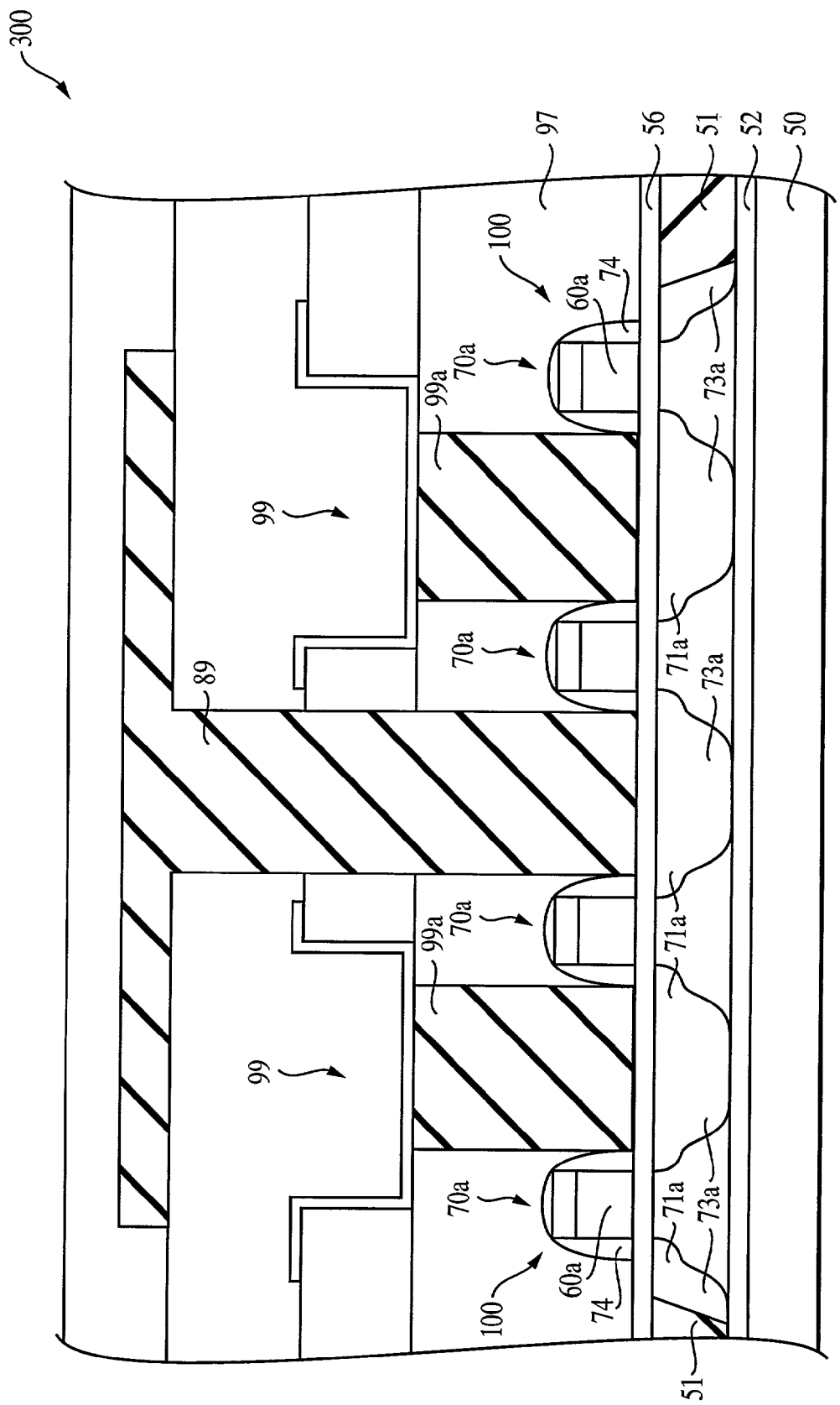
FIG. 23 is a cross-sectional view of a DRAM memory device fabricated on the SOI substrate of FIG. 5 and comprising at least one FD SOI NMOS device fabricated in accordance with the present invention.

As illustrated in FIG. 23, the DRAM memory device 300 is formed of a pair of memory cells comprising respective access FD SOI NMOS transistors, at least one being a p+ gate FD SOI NMOS transistor 100 formed according to the present invention. FIG. 23 depicts conductors 89 and capacitors 99 with associated conductive plugs 99a, all formed within one or more insulating layers, such as insulating layer 97, formed over the access FD SOI NMOS transistors 100.

Figure 24:
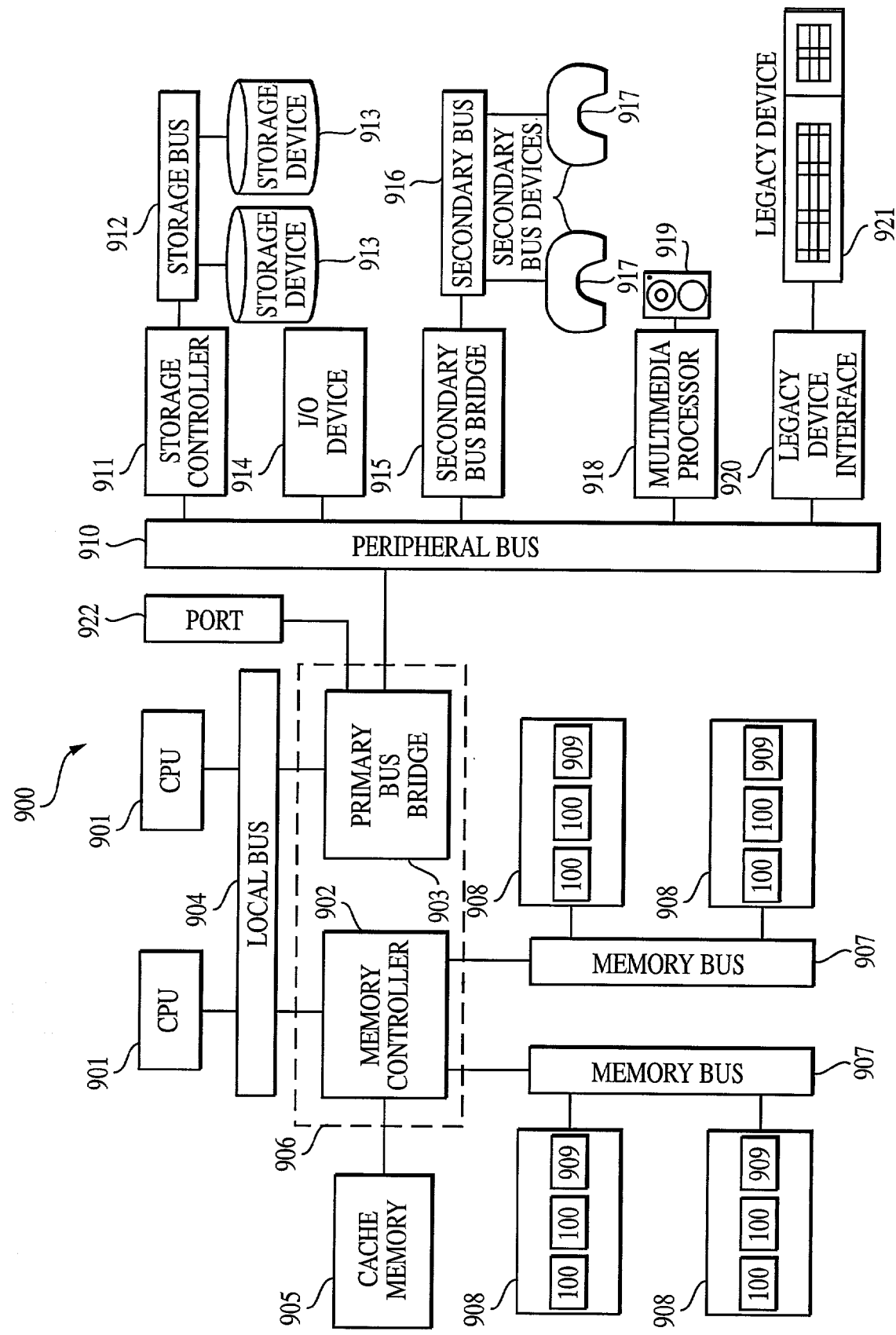
FIG. 24 is an illustration of a processing system having a memory cell access transistor comprising a MOSFET device constructed on a SOI substrate according to the present invention.

The DRAM memory device 300 (FIG. 23) containing at least one filly-depleted (FD) SOI NMOS transistor 100 (FIG. 19), either by itself or in combination with the partially-depleted (PD) SOI NMOS transistor 200, may now be employed in any integrated circuit structures, for example, in a processing system such as the one illustrated in FIG. 24. The exemplary processing system 900 of FIG. 24 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one p+ gate FD SOI NMOS device 100 of the present invention, either by itself or in combination with the partially-depleted (PD) SOI NMOS transistor 200. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 24 is only an exemplary processing system with which the invention may be used. While FIG. 24 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 a p+ gate FD SOI NMOS device 100, either by itself or in combination with the n+ gate PD SOI NMOS transistor 200. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Although the present invention has been described with reference to a SOI substrate 40 (FIGS. 5–19) formed by a bonding and etching back method, it must be understood that the present invention is not limited to the above fabrication method. Accordingly, other methods known in the art, for example, the ELTRAN process, may be also used, as desired.

Further, although the exemplary embodiments of the present invention have been described for only one fully-depleted (FD) SOI NMOS transistor 100 (FIGS. 5–19) formed in the memory array area, and for only one partially-depleted (PD) SOI NMOS transistor 200 (FIGS. 5–19) formed in the periphery area, it must be understood that the present invention contemplates the formation of a plurality of such MOSFET devices in their respective area of the same or different conductivity type.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming a semiconductor device comprising the acts of:
   providing a SOI substrate;
   forming at least one isolation region in said SOI substrate for separating at least one periphery region of said SOI substrate from at least one memory array region of said SOI substrate;
   forming at least one partially-depleted SOI NMOSFET device in said periphery region of said SOI substrate; and
   forming at least one fully-depleted SOI NMOSFET device in said memory array region of said SOI substrate, said fully-depleted SOI NMOSFET device comprising a silicon/germanium gate electrode of p-type conductivity.

2. The method of claim 1, wherein said gate electrode of said fully-depleted SOI MOSFET device is formed of a silicon/germanium layer provided over said memory array region.

3. The method of claim 2 further comprising the act of subjecting said silicon/germanium layer to a first implantation with a p-type dopant.

4. The method of claim 3, wherein said first implantation is conducted at an energy of about 1 keV to about 50 keV.

5. The method of claim 4, wherein said first implantation is further conducted at a dose concentration of about $1\times10^{14}/cm^2$ to about $5\times10^{15}/cm^2$.

6. The method of claim 2 further comprising the act of providing an oxide layer on said memory array region of said SOI substrate before said act of providing said silicon/germanium layer.

7. The method of claim 6 further comprising the act of providing a silicide layer over said silicon/germanium layer.

8. The method of claim 7 further comprising the act of providing a dielectric cap layer over said silicide layer.

9. The method of claim 8, wherein said act of forming said fully-depleted SOI NMOSFET device further includes the act of patterning said silicon/germanium layer, said silicide layer and said dielectric cap layer formed over said memory array region.

10. The method of claim 9, wherein said act of forming said fully-depleted SOI NMOSFET device further includes the act of etching said silicon/germanium layer, said silicide layer and said dielectric cap layer to form a gate stack.

11. The method of claim 10 further comprising the act of forming source and drain regions on opposite sides of said gate stack and in said memory array region.

12. The method of claim 11, wherein said act of forming source and drain regions further comprises the act of subjecting said gate stack to a second implantation with an n-type dopant.

13. The method of claim 12, wherein said second implantation is conducted at an energy of about 1 keV to about 60 keV.

14. The method of claim 13, wherein said second implantation is further conducted at a dose concentration of about $1\times10^{14}/cm^2$ to about $5\times10^{15}/cm^2$.

* * * * *

UNITED STATES PATENT AND TRADEMARK OFFICE
CERTIFICATE OF CORRECTION

PATENT NO. : 7,189,606 B2
APPLICATION NO. : 10/161615
DATED : March 13, 2007
INVENTOR(S) : Hongmei Wang et al.

Page 1 of 2

It is certified that error appears in the above-identified patent and that said Letters Patent is hereby corrected as shown below:

On Title Page item 56

In the Other Publications portion of the References Cited section, the following error is corrected:

"Gary E. McGuire, "Semiconductor Materials and Ptocess Technology Handbook," Noyes Publ., Norwich, New York, (1988) pp. 46-47."

Should read

--Gary E. McGuire, "Semiconductor Materials and Process Technology Handbook," Noyes Publ., Norwich, New York, (1988) pp. 46-47.--

In the Specification, the following errors are corrected:

Column 2, line 64, "filly-" should read --fully--;

Column 3, line 21, "extra a silicon" should read --extra silicon--;

Column 5, line 24, "filly-depleted" should read --fully-depleted--;

Column 5, line 54, "saphire-" should read --sapphire- --;

Column 5, line 63, "saphire" should read --sapphire--;

Column 12, line 28, "filly-depleted" should read --fully-depleted--;

Column 12, line 62, "filly-depleted" should read --fully-depleted--;

Column 13, line 3, "coupled the" should read --coupled to the--;

Column 13, line 26, "include" should read --includes--;

Column 13, lines 36-37, "an miscellaneous" should read --miscellaneous--;

Column 13, line 38, "an legacy" should read --a legacy--;

Column 13, line 39, "also coupled" should read --also be coupled--;

Column 13, line 49, "an local" should read --a local--;

UNITED STATES PATENT AND TRADEMARK OFFICE
CERTIFICATE OF CORRECTION

PATENT NO. : 7,189,606 B2
APPLICATION NO. : 10/161615
DATED : March 13, 2007
INVENTOR(S) : Hongmei Wang et al.

It is certified that error appears in the above-identified patent and that said Letters Patent is hereby corrected as shown below:

Column 13, line 53, "an universal" should read --a universal--;

Column 13, line 54, "via to the" should read --via the--;

Column 13, line 57, "to one additional" should read --to additional--; and

Column 14, line 10, "system" should read --systems--.

Signed and Sealed this

Twelfth Day of June, 2007

JON W. DUDAS
*Director of the United States Patent and Trademark Office*